United States Patent [19]

Bach

[11] Patent Number: 4,845,013

[45] Date of Patent: Jul. 4, 1989

[54] AFTERTREATMENT OF RELIEF PLATES USING SOLUTION COMPRISING A CARBOXYLIC ACID AND A BROMIDE

[75] Inventor: Helmut Bach, Mutterstadt, Fed. Rep. of Germany

[73] Assignee: BASF Aktiengesellschaft, Ludwigshafen, Fed. Rep. of Germany

[21] Appl. No.: 277,430

[22] Filed: Nov. 28, 1988

Related U.S. Application Data

[63] Continuation of Ser. No. 77,633, Jul. 24, 1987, abandoned.

[30] Foreign Application Priority Data

Jul. 25, 1986 [DE] Fed. Rep. of Germany ....... 3625264

[51] Int. Cl.[4] .................... G03C 5/24; G03C 5/30; G03C 5/34
[52] U.S. Cl. .................... 430/309; 430/331; 430/306
[58] Field of Search ........... 430/331, 306, 309

[56] References Cited

U.S. PATENT DOCUMENTS

| | | | |
|---|---|---|---|
| 3,255,004 | 6/1966 | Thommes | 96/35 |
| 3,968,316 | 7/1976 | Jyo et al. | 428/440 |
| 4,177,074 | 12/1979 | Proskow | 430/286 |
| 4,400,459 | 8/1983 | Gruetzmacher et al. | 430/306 |
| 4,400,460 | 8/1983 | Fickes et al. | 430/306 |
| 4,451,553 | 5/1984 | Fickes et al. | 430/306 |
| 4,452,879 | 6/1984 | Fickes et al. | 430/306 |
| 4,460,675 | 7/1984 | Gruetzmacher et al. | 430/309 |

FOREIGN PATENT DOCUMENTS 0096835 12/1983 European Pat. Off. .
2823300 12/1979 Fed. Rep. of Germany .

OTHER PUBLICATIONS

Patent Abstracts of Japan, vol. 7, No. 202 (P-221) [1347], Sep. 7, 1983.

*Primary Examiner*—Paul R. Michl
*Assistant Examiner*—Patrick A. Doody
*Attorney, Agent, or Firm*—Keil & Weinkauf

[57] ABSTRACT

Relief plates which are produced by imagewise photopolymerization of layers which contain, as binders, block copolymers of conjugated dienes and vinylaromatics are aftertreated with an aqueous solution of a mixture of bromates, bromides and acids by a process in which amidosulfonic acid and/or aliphatic di-, tri- and-/or tetracarboxylic acids are used as the acids.

4 Claims, No Drawings

AFTERTREATMENT OF RELIEF PLATES USING SOLUTION COMPRISING A CARBOXYLIC ACID AND A BROMIDE

This application is a continuation of application Ser. No. 077,633, filed on July 24, 1987, now abandoned.

The present invention relates to an improved process for the aftertreatment of relief plates which are crosslinked by imagewise photopolymerization and contain, as binders, in the relief layer, one or more block copolymers of conjugated dienes and vinylaromatics, with aqueous solutions of mixtures of bromates, bromides and acids. The present invention furthermore relates to relief plates having improved performance characteristics.

Apart from the improvement according to the invention, a process of this type is disclosed in DE-A No. 28 23 300, hydrochloric acid generally being used in this procedure.

The disadvantage of the known process is that bromine fumes frequently form above the liquid surface when hydrochloric acid is used to prepare the aftertreatment solution, giving rise to safety problems. Moreover, the components of this aftertreatment solution cannot be supplied in premixed form to the end user, who has to combine the said components himself in the correct proportions directly before use; safety reasons dictate that, for this purpose, the end user, i.e. the reprographer, must have certain chemical knowledge which is outside his specialist area and therefore prevents wide use of this aftertreatment method. Another disadvantage is that, although the known process effectively eliminates the tackiness of the surface of relief plates crosslinked by imagewise photopolymerization and containing block copolymers of conjugated dienes and vinylaromatics as binders in the relief layer, the times required for this purpose have to be very carefully observed, since otherwise the aftertreated surfaces become brittle and tend to crack. Even when these times are observed exactly, the relief plates aftertreated in the conventional manner nevertheless become brittle and crack on prolonged storage and/or during prolonged use, for example as printing plates for flexographic printing; this considerably restricts their life, particularly as printing plates.

It is an object of the present invention to improve the conventional bromate/bromide/hydrochloric acid aftertreatment process for relief plates crosslinked by imagewise photopolymerization and containing, as binders, in the relief layer, block copolymers of conjugated dienes and vinylaromatics, in such a way that the above disadvantages of the process are eliminated. It is a further object of the present invention to provide a process which not only eliminates the surface tackiness of the relief plates but also stabilizes the said plates to embrittlement and cracking on prolonged storage and/or during continuous use.

We have found that these objects are achieved by a process for the aftertreatment of relief plates which are produced by imagewise photopolymerization of layers which contain, as binders, block copolymers of conjugated dienes and vinylaromatics, in which an aqueous solution of a mixture of bromates, bromides and acids is used, and wherein the acids used are amidosulfonic acid and/or aliphatic di-, tri- and/or tetracarboxylic acids.

Examples of suitable bromates to be used according to the invention are alkali metal and alkaline earth metal bromates, potassium bromate being preferred.

Examples of suitable bromides to be used according to the invention are alkali metal and alkaline earth metal bromides, potassium bromide being preferred.

Examples of suitable di-, tri- or tetracarboxylic acids to be used according to the invention are malonic acid, succinic acid, glutaric acid, adipic acid, pimelic acid, sebacic acid, azelaic acid, tartronic acid, malic acid, tartaric acid, itamalic acid, citramalic acid, cyclohexane-1,2-dicarboxylic acid, citric acid, methanetetraacetic acid and hexane-2,3,5,6-tetracarboxylic acid or mixtures of these, succinic acid, glutaric acid and/or adipic acid being preferred.

The use of amidosulfonic acid is particularly advantageous according to the invention.

In general, the components of the aftertreatment solution to be used according to the invention are dissolved in water in an amount such that a 0.01–10, in particular 0.1–1, % strength by weight solution of bromine in water is formed in accordance with equation 1

$$5Br^{\ominus} + BrO_3^{\ominus} + 6H^{\oplus} \rightarrow 3Br_2 + 3H_2O \qquad \text{Eq. 1.}$$

The components may be added to the water in the required amount, individually or as a preprepared solid mixture.

The aftertreatment solution can also contain anionic or cationic surfactants which have a saturated hydrocarbon chain of 8 to 20 carbon atoms or one or more perfluorinated carbon chains of 5 to 18 carbon atoms, and/or ethylene oxide/propylene oxide block copolymers and/or alkylglucosides in an amount of from 0.001 to 2% by weight.

The novel process has no special features in terms of the method, ie. the relief plates obtained by imagewise exposure to actinic light and by washing out the unexposed uncrosslinked parts in a conventional manner from the relief-forming layers crosslinked by photopolyerization are, if necessary, dried and/or postexposed uniformly to actinic light and are then sprayed with the aftertreatment solution to be used according to the invention or are immersed in this solution. In both cases, a residence time of from 10 seconds to 20 minutes, preferably from 12 seconds to 15 minutes, in particular from 15 seconds to 10 minutes, has proven advantageous, and it is not necessary to observe certan times exactly.

In general, the aftertreatment is followed by a conventional step involving washing with water, in which residual bromine is washed away from the relief surface. It is advantageous for the washwater to contain reducing substances, such as sodium thiosulfate or formaldehyde sodium sulfoxylate ($HOCH_2SO_2Na$) in an amount of from 0.01 to 1% by weight. The washwater may furthermore contain from 0.001 to 2% by weight of the abovementioned surfactants. Conventional washing times are from 5 to 120, preferably from 10 to 60, in particular from 15 to 40, seconds. The relief plates are then dried and, if necessary, post-exposed uniformly to actinic light.

The novel process is applied to conventional relief plates crosslinked by photopolymerization and obtained, as described above, by imagewise exposure to actinic light and washing out the unexposed uncrosslinked parts of the layers, with suitable developers, from relief-forming layers which are crosslinkable by photopolymerization and contain block copolymers of conjugated dienes and vinyl-aromatics as binders.

Examples of suitable developers are conventional solvents, such as perchloroethylene/n-butanol mixtures, limonene, toluene, ethylbenzene and N-methylpyrrolidone and mixtures of these.

Examples of suitable sources of actinic light are the conventional mercury high pressure, medium pressure and low pressure lamps, UV fluorescence tubes and metal halide-doped lamps.

Examples of suitable block copolymers which are used as binders and consist of conjugated dienes and vinylaromatics are polymers which contain one or more elastomeric diene polymer blocks X and one or more thermoplastic vinylaromatic polymer blocks Y, the blocks X and Y generally being chemically bonded to one another via carbon-carbon bonds. In a given block copolymer, a block X may also be bonded to a block Y by a random or alternate copolymer which contains conjugated dienes and vinylaromatics as copolymerized units; however, bonding of the blocks X and Y may be effected by means of a copolymer of conjugated dienes and vinylaromatics, in which the concentration of copolymerized conjugated dienes decreases from block X to block Y, while the concentration of copolymerized vinylaromatics increases.

Furthermore, such block copolymers may be linked to form even larger block copolymer assemblies via suitable polyvalent atoms or ions and inorganic, organic or organometallic moieties. In this context, linking is understood as the formation of covalent or ionic bonds between two molecular moieties.

Moreover the olefinic and aromatic bonds or only the olefinic bonds in the diene polymer blocks X may be partly or completely hydrogenated. Furthermore, the blocks X and Y can contain, as copolymerized units, further monomers, which need not be conjugated dienes and vinylaromatics, for example acrylonitrile, acrylic acid, maleic anhydride, (meth)acrylamides or (meth)acrylates, the amount of these in the block copolymer generally not exceeding 10% by weight. The blocks X may also contain vinylaromatics as copolymerized units, the amount of these being chosen so that it does not adversely affect the elastomeric properties of the blocks X. The blocks Y can also contain a sufficient amount of conjugated dienes as copolymerized units to prevent them from losing their thermoplastic processability.

If a block copolymer contains a plurality of elastomeric blocks X and/or thermoplastic blocks Y, the blocks X and/or Y need not be chemically identical or very similar but may differ substantially from one another, provided that they always have the required elastomeric or thermoplastic properties.

In general, blocks X have a glass transition temperature Tg of less than 20° C., preferably less than 0° C., in particular less than $-15°$ C. These blocks can in general have a mean molecular weight of from $10^3$ to $2 \cdot 10^5$. In general, they contain from 30 to 100, in particular from 30 to 95, % by weight, based on the particular block X, of copolymerized conjugated dienes.

In general, blocks Y have a glass transition temperature Tg greater than 20° C. and a mean molecular weight of from $1.5 \cdot 10^3$ to $2 \cdot 10^6$, preferably from $5 \cdot 10^3$ to $1.5 \cdot 10^6$, in particular from $10^4$ to $1.2 \cdot 10^6$, and contain from 30 to 100, in particular from 40 to 90, % by weight, based on the particular block Y, of copolymerized vinylaromatics.

Examples of suitable conjugated dienes are butadiene, isoprene, pentane-1,3-diene, 2,3-dimethylbutadiene and hexane-2,4-diene, butadiene and/or isoprene being preferred.

Examples of suitable vinylaromatics are styrene, α-methylstyrene, p-methylstyrene, p-tert-butylstyrene and 1-vinylnaphthalene, styrene being preferred.

Examples of particularly suitable block copolymers are thermoplastic elastomeric three-block copolymers Y-X-X', in which Y is a thermoplastic, nonresilient styrene polymer block, X is an elastomeric butadiene and/or isoprene polymer block and X' is an elastomeric polymer block which differs from X and consists of copolymerized butadiene and/or isoprene with or without copolymerized styrene.

In general, the relief-forming layers crosslinkable by photopolymerization contain these block copolymers in an amount of from 40 to 99, preferably from 60 to 98, in particular from 70 to 95, % by weight, based on the particular layer, as binders.

It is known that, in addition to the abovementioned block copolymers, these relief-forming layers always contain photopolymerizable monomers, compatible with the said block copolymers, and the photoinitiators required to initiate the photopolymerization. Moreover, the layers may contain further additives, for example thermal polymerization inhibitors, dyes, pigments, photochromic substances, antihalation agents, plasticizers, antioxidants, antiozonants, agents for improving the relief structure, crosslinking assistants, fillers and/or reinforcing fillers in effective amounts.

Such layers are produced from their components in general by mixing the latter by a conventional mixing method and by processing the mixture to give a layer by a conventional technique, such as casting from solution, calendering or extrusion; these measures may also be combined with one another in a suitable manner.

The layers as such can be processed to relief plates in a conventional manner and then aftertreated by the procedure according to the invention. However, they can also be processed in a known manner as a composite with other suitable layer-like materials to give relief plates and then be aftertreated. Such composites are usually referred to as multilayer elements.

The relief plates produced by a conventional method and aftertreated in the manner according to the invention can be used as decorative surfaces, as printing plates for lithographic, letterpress and flexographic printing and as photoresists. They are preferably employed as printing plates for flexographic printing, in particular continuous printing.

The novel aftertreatment process has many advantages over the prior art. For example, the effective components of the aftertreatment solution, the bromates, bromides and acids, can be supplied to the reprographer in the form of a ready-prepared, easily meterable mixture which has an unlimited shelf life in the dry state. The reprographer need only dissolve the said mixture in water, and extensive technical safety measures and special chemical knowledge are not required for this purpose. Furthermore, the optimum aftertreatment time determined by preliminary experiments need not be stringently observed in order to avoid damaging the surface of the relief plates; if required by the procedure, these times can readily be exceeded, thus allowing substantially more latitude in coordinating operations in a reprographic establishment. An additional advantage is that the aftertreatment solutions to be used according to the invention have a longer shelf life and, even after prolonged standing and/or repeated use, can be regenerated by adding a further amount of the bromate/bromide/acid mixture to be used according to the invention, without having adverse effects. In addition, they are less corrosive than the known aftertreatment solutions. Furthermore, the novel aftertreatment process not only improves the surface of the relief plates with respect to tack, the uniformity of the dullness and the optical homogeneity, but also stabilizes the said surface to embrittlement and cracking on prolonged storage and/or during continuous use. Such relief plates can therefore be used much more frequently and for longer periods in flexographic printing than relief plates aftertreated by prior art processes. Accordingly, relief plates aftertreated according to the invention also give a very much longer print run comprising excellent prints. Moreover, these relief plates exhibit excellent ink acceptance but are extremely stable to the printing ink solvents and are not swelled by these to a troublesome extent.

EXAMPLES AND COMPARATIVE EXPERIMENTS

In the Examples and Comparative Experiments below, the surface tack of the relief plates was determined by touch and was rated as follows:
Rating 1—nontacky
Rating 2—slightly tacky
Rating 3—highly tacky.

The uniformity of the mat finish and the degree of optical homogeneity of the surfaces were determined with the aid of scanning electron micrographs and were rated as follows:
Rating 1—uniformly mat, structureless surface
Rating 2—uniformly mat, slightly structured surface
Rating 3—nonuniformly mat , structured surface
Rating 4—inhomogeneous, rough surface.

For the Examples and Comparative Experiments, commercial flexographic printing plates (multilayer elements) having a known relief-forming layer crosslinkable by photopolymerization were first produced in a conventional manner. The bases used were 125 $\mu$m thick polyethylene terephthalate films, which, before application of the layers, were coated with 0.3 $\mu$m thick polyurethane adhesion-promoting layers. The relief-forming layers themselves were 700 $\mu$m thick and, based on a layer, contained as the binder:

90.917% by weight of a block copolymer Y-X-X' having a viscosity number VN of 164.9 ml/g and a mean molecular weight of $1.9 \cdot 10^5$ and composed of
10% by weight of polystyrene as block Y,
70% by weight of polyisoprene (glass transition temperature Tg $-35°$ C.) as block X and
20% by weight of polyisoprene containing 53% of 3,4-structures (glass transition temperature Tg $+10°$ C.) as block X', based on the block copolymer;
as the photopolymerizable monomer:
7.268% by weight of hexane-1,6-diol diacrylate; as the photoinitiator:
1.350% by weight of benzil dimethyl acetal; and as additives:
0.457% by weight of 2,6-di-tert-butyl p-cresol and
0.008% by weight of Solvent Black 3 (C.I. 26150).

2 $\mu$m thick layers of cyclized rubber having a high degree of cyclization were used as protective layers.

These flexographic printing plates were first preexposed uniformly for 2 minutes from the back in a tubular exposure unit, then exposed imagewise for 22 minutes through a photographic negative resting on top of the protective layer, and then developed at 30° C. in a brush washer with a perchloroethylene/n-butanol mixture, the unexposed, uncrosslinked parts of the flexographic printing plates being removed.

The resulting relief plates were dried for 2 hours at 65° C. and stored for 15 hours at room temperature. The relief plates were then subjected to various aftertreatments.

EXAMPLES 1 to 3

Novel aftertreatment of relief plates; test method:
An aftertreatment solution was prepared from 507.54 g of KBr, 142.46 g of $KBrO_3$, 1000 g of amidosulfonic acid and 100 of water and used for Examples 1 to 3.

EXAMPLE 1

Directly after their production, two relief plates were immersed in the aftertreatment solution and left there for 5 minutes.

EXAMPLE 2

Simultaneously with the relief plates from Example 1, two further relief plates were immersed in the solution and left there for 1 hour.

EXAMPLE 3

The aftertreatment solution was left to stand for 1 week, after which two relief plates were again immersed in the solution and left there for 5 minutes.

After being removed from the aftertreatment solution, all six relief plates were immersed in a solution of 1% by weight of sodium thiosulfate, 1% by weight of a sodium paraffinsulfonate and 98% by weight of water and left there for 30 seconds. The relief plates were then dried and postexposed uniformly to actinic light.

All six relief plates had a nontacky (rating 1), uniformly mat , structureless (rating 1) surface. One relief plate from each pair of relief plates aftertreated in the same manner was stored in the air for 3 months. Even after this time, their surface showed no embrittlement and no cracks. The remaining relief plates were clamped on printing cylinders for continuous printing in a flexographic printing unit and still gave excellent results even after a print run of up to $10^6$ printed copies. The printing cylinders were used repeatedly in this manner without there being any loss of information compared with the original photographic negative.

COMPARATIVE EXPERIMENTS A to C

Aftertreatment of relief plates by the prior art method; test method:
An aftertreatment solution was prepared from 507.54 g of KBr, 142.46 g of $KBrO_3$, 1000 ml of concentrated hydrochloric acid and 100 of water and was used for Comparative Experiments A to C.

COMPARATIVE EXPERIMENT A

Example 1 was repeated using the known aftertreatment solution.

COMPARATIVE EXPERIMENT B

Example 2 was repeated, likewise using this solution.

COMPARATIVE EXPERIMENT C

Example 3 was also repeated using this solution.

The further treatment of the six relief plates was carried out as described in Examples 1 to 3.

All three pairs of relief plates had a nontacky (rating 1) surface; however, in the remaining properties, they differed substantially from one another and from the pairs aftertreated in the manner according to the invention.

Although the relief plates obtained in Comparative Experiment A had a uniformly mat, slightly structured (rating 2) surface, this surface became brittle and cracked after storage for 3 months. Printing tests showed that they did not meet the quality requirements set for a printing plate for continuous printing.

The relief plates obtained in Comparative Experiment B had an inhomogeneous rough (rating 4) surface which rapidly became brittle and cracked. The relief plates could not be used as printing plates.

The relief plates obtained in Comparative Experiment C had a nonuniformly mat, structured (rating 3) surface which rapidly became brittle and cracked. When employed as printing plates, the relief plates gave copies of inferior quality and could only be used once for printing.

EXAMPLE 4

Novel aftertreatment of a relief plate; test method:

An aftertreatment solution was prepared as stated in Examples 1 to 3, except that, instead of the amidosulfonic acid, a mixture of 29% by weight of adipic acid, 44% by weight of glutaric acid and 27% by weight of succinic acid were used, the percentages being based on the mixture. 200 g of a sodium paraffinsulfonate were also added to this solution.

Two relief plates were immersed in this solution for 10 minutes and were further treated as described in Examples 1 to 3.

The surface of the relief plates after this treatment was nontacky (rating 1) and uniformly mat and structureless (rating 1). One of the two relief plates was stored for 3 months without embrittlement or cracking occurring. The other relief plate was used for printing purposes, as described in Examples 1 to 3, and repeatedly gave excellent copies in a print run of $10^6$ in each case. Even after being subjected to stress repeatedly in this way, the plates showed no embrittlement or cracking on further storage of the printing cylinder.

I claim:

1. A process for the aftertreatment of relief printing plates which are prepared by the imagewise photopolymerization of layers containing as the binders, block copolymers of conjugated dienes and vinylaromatics, and by liquid development of the unexposed and thus nonphotopolymerized parts of the layers, said process comprising the step of treating the surface of said relief printing plates with an aqueous solution of bromates, bromides and one or more acids selected from the group consisting of aliphatic di-, tri- and tetracarboxylic acids.

2. The process of claim 1, wherein the aqueous solution contains one or more of succinic, glutaric and adipic acids.

3. A storable composition for use in the aftertreatment of relief printing plates containing one or more block copolymers of conjugated dienes and vinylaromatics in the relief layer, which composition can be activated by the addition of water and which comprises: a mixture of one or more solid acids selected from the group consisting of aliphatic di-, tri- and tetracarboxylic acids and at least one solid alkali metal or alkaline earth metal bromate or bromide.

4. The composition of claim 3, wherein the acid in the composition is succinic, glutaric or adipic acid or mixtures thereof.

* * * * *